ated Nov. 22, 1988

United States Patent [19]
Yau et al.

[11] Patent Number: 4,786,612
[45] Date of Patent: Nov. 22, 1988

[54] PLASMA ENHANCED CHEMICAL VAPOR DEPOSITED VERTICAL SILICON NITRIDE RESISTOR

[75] Inventors: Leopoldo D. Yau, Portland, Oreg.; Shih-Ou Chen, Fremont, Calif.; Yih S. Lin, Beaverton, Oreg.

[73] Assignee: Intel Corporation, Santa Clara, Calif.

[21] Appl. No.: 139,187

[22] Filed: Dec. 29, 1987

Related U.S. Application Data

[63] Continuation of Ser. No. 825,314, Feb. 3, 1986, abandoned.

[51] Int. Cl.[4] .......................... H01C 7/10; H01L 29/04
[52] U.S. Cl. .............................. 437/47; 148/DIG. 114; 148/DIG. 136; 357/51; 437/60; 437/193; 437/200; 437/241; 437/918
[58] Field of Search ............... 148/DIG. 83, 104, 118, 148/136, 147, 114; 357/51; 437/60, 193, 200, 241, 918

[56] References Cited
U.S. PATENT DOCUMENTS

| | | | |
|---|---|---|---|
| 4,291,328 | 9/1981 | Lien et al. | 357/59 |
| 4,403,394 | 9/1983 | Shepard et al. | 29/571 |
| 4,406,051 | 9/1983 | Iizuka | 29/576 B |
| 4,420,766 | 12/1983 | Kasten | 357/59 |
| 4,477,310 | 10/1984 | Park et al. | 156/643 |
| 4,547,959 | 10/1985 | Rusch | 27/577 C |
| 4,569,122 | 2/1986 | Chan | 29/577 C |
| 4,609,903 | 9/1986 | Toyokura et al. | 338/22 SD |
| 4,609,935 | 9/1986 | Kondo | 357/51 |

FOREIGN PATENT DOCUMENTS

58-50770  3/1983  Japan ........................... 357/51

Primary Examiner—Brian E. Hearn
Assistant Examiner—William Bunch
Attorney, Agent, or Firm—Blakely, Sokoloff, Taylor & Zafman

[57] ABSTRACT

An improved resistor for use in MOS integrated circuits. An opening is formed in an insulative layer which separates two conductive regions. A plasma enhanced chemical vapor deposition of passivation material such as silicon-rich silicon nitride is deposited in the window, contacting both conductive regions and providing resistance in a vertical direction between these regions.

11 Claims, 7 Drawing Sheets

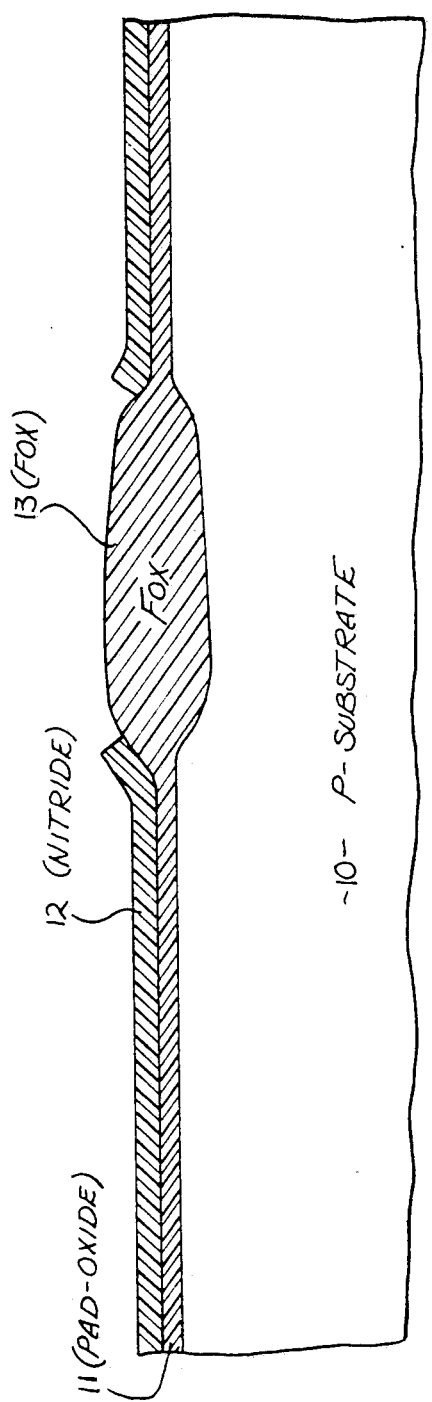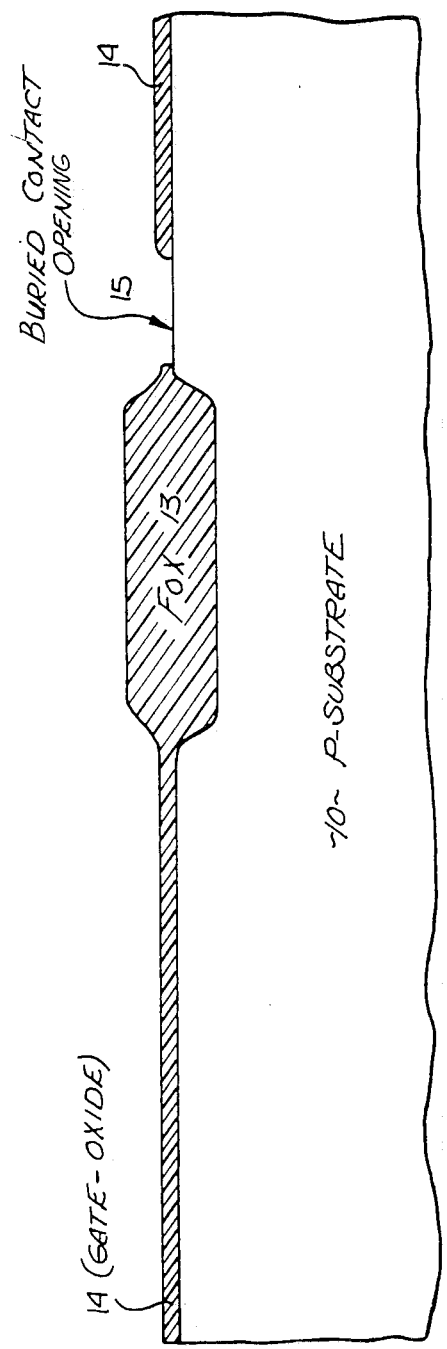

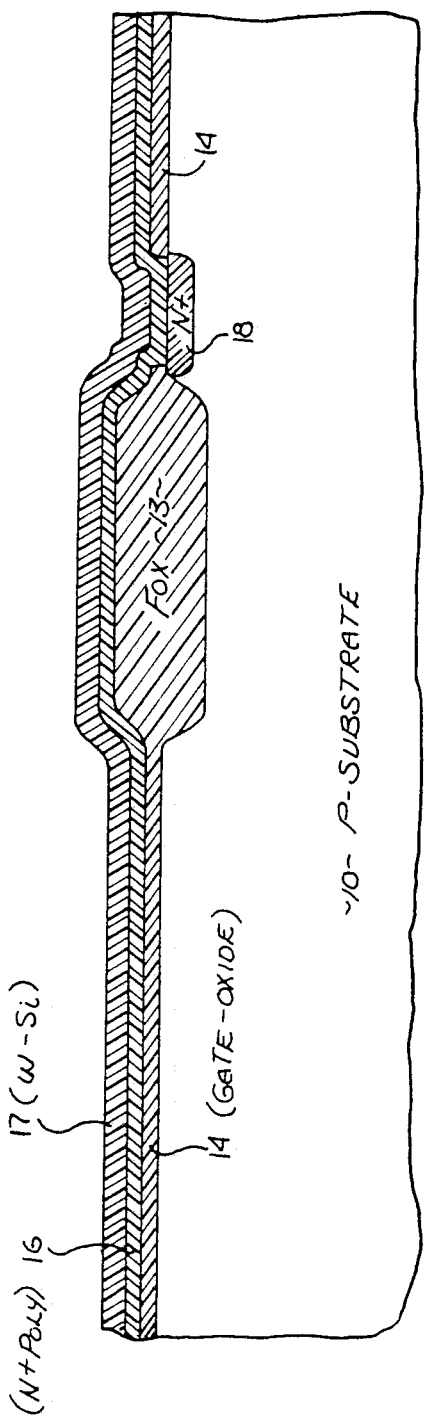
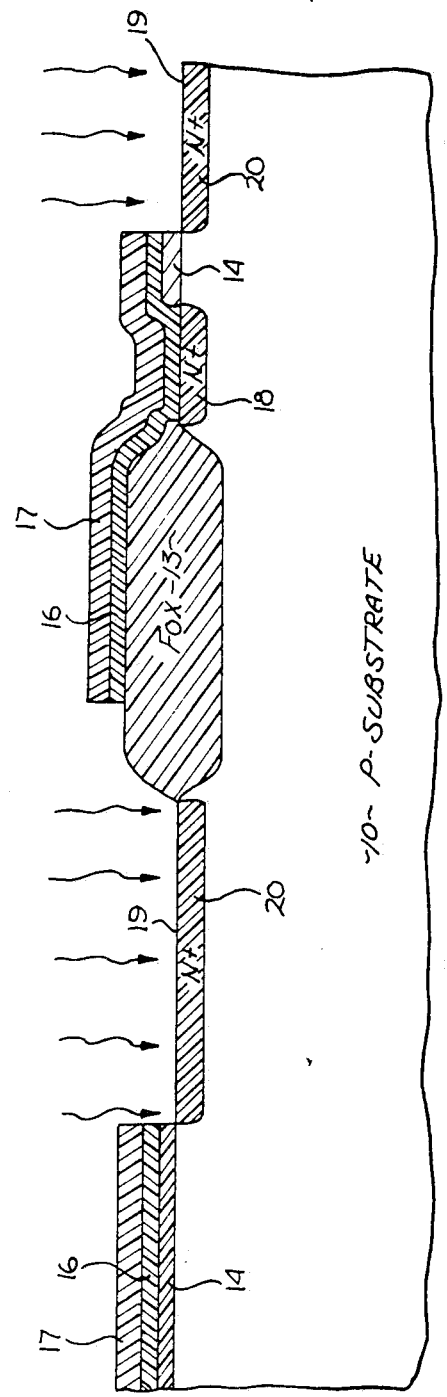

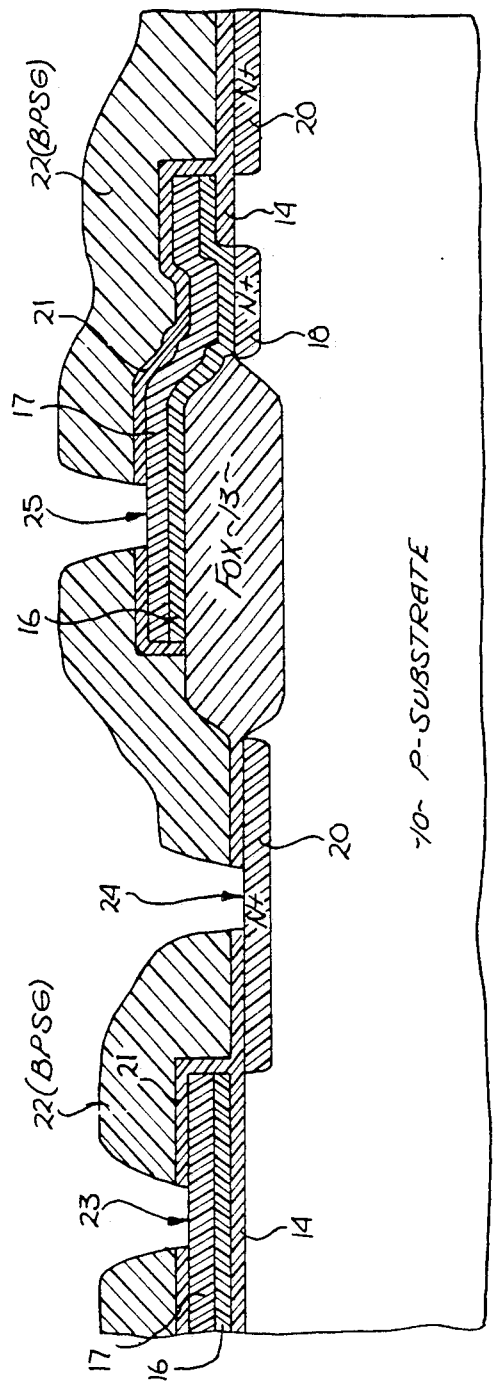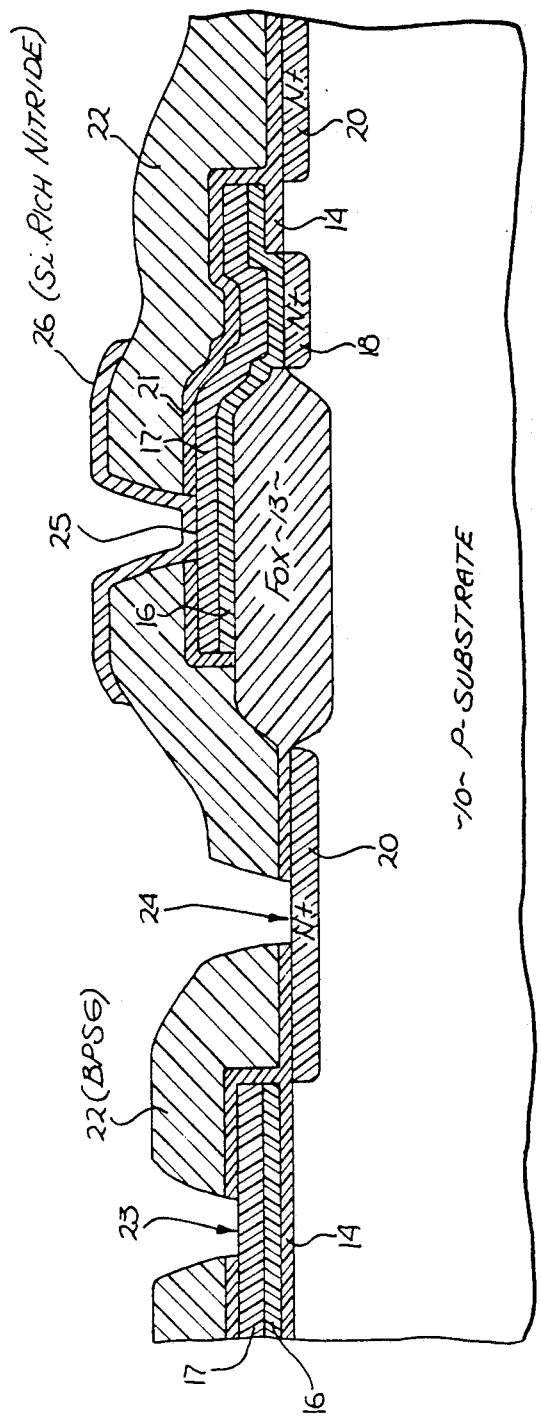

PLASMA ENHANCED CHEMICAL VAPOR DEPOSITED VERTICAL SILICON NITRIDE RESISTOR

This is a continuation of application Ser. No. 825,314 filed 2-3-86, abandoned.

BACKGROUND OF THE INVENTION

1. Field of the Invention

The invention relates to the field of MOS integrated circuits, and particularly to the formation of resistor elements in such circuits.

2. Prior Art

In the early years of metal-oxide-semiconductor (MOS) technology, resistance elements for integrated circuits were provided by diffused regions in the substrate, polysilicon members, and the like. These elements, which occupied relatively large areas in the circuit, are not as widely used with the advent of more complex circuitry requiring higher densities.

The lack of adequate resistors for use in high-density semiconductor integrated circuits led to an avoidance of their use. Circuits were deliberately designed to use fewer resistors, and transistors were, in many cases, used as load devices in place of resistors. The static memory cell, for instance, has traditionally been constructed as a six-transistor bistable circuit, in which two of the six transistors serve as load devices.

Resistor elements utilizing ion-implanted regions have been described in U.S. Pat. No. 4,246,692 (implanted regions buried beneath field oxide), U.S. Pat. No. 4,110,776 (implanted resistors over field oxide), U.S. Pat. No. 4,209,716 (implanted resistors in second-level polysilicon) and U.S. Pat. No. 4,330,931 (polysilicon and tungsten composition members). The closest prior art examples known to Applicant are the vertically-oriented buried polysilicon resistor element described by Yoshio Sakai et al, 1984 Symposium on VSLI Technology Digest of Technical Papers, p. 6–7, September 1984, and the ion implanted polysilicon resistor element described in U.S. Pat. No. 4,416,049 and the plasma enhanced chemical vapor deposition described by A. C. Adams, *VLSI Technology*, pp. 93–129, edited by S. M. Sze, McGraw-Hill, 1983.

Each of these prior art techniques presents associated difficulties. The conductivity of polysilicon creates a need for relatively large polysilicon resistor elements, since a relatively long pathway is required to achieve the desired resistance. Many of the prior art techniques require critical masking steps to achieve the necessary precision in the length and width of the polysilicon load. Use of polysilicon loads can also give a high surface contour, leading to fracturing of the films on the final circuit. The high diffusivity for boron or phosphorus dopants in polysilicon lends additional difficulties to the use of high-resistive polysilicon regions as load devices.

The present invention represents a departure from previous technologies. This invention uses a plasma enhanced chemical vapor deposition silicon-rich nitride film as a contact-window-load device. This film is not polysilicon, although it could have micro-polysilicon inter-mixed with nitride, and presents a number of advantages over polysilicon for use as a resistor element.

SUMMARY OF THE INVENTION

An improved resistor element is described for use in MOS integrated circuits. This resistor element serves as a contact-window-load device between two conductive regions separated by an insulative layer. An opening is formed in the insulative layer, and a plasma enhanced chemical vapor deposition (PECVD) silicon (Si)-rich nitride is deposited and patterned to leave the Si-rich nitride over the contact window. This Si-rich nitride film contacts both conductive regions (above and below the insulative layer) and provides resistance in a vertical direction between these regions.

The plasma process allows for deposition of the Si-rich film at low temperatures and provides for a resistive load in a semiconductor device. Although the preferred embodiment illustrates the use of the resistive material in a memory cell, it will be obvious to one skilled in the art that this technique may be utilized in other integrated circuits.

BRIEF DESCRIPTION OF THE DRAWINGS

FIG. 1 is a cross-sectional elevation view of a portion of silicon substrate which includes a field oxide region, a pad-oxide layer and a nitride layer.

FIG. 2 illustrates deposition of a gate oxide layer and a buried contact opening in the gate-oxide layer.

FIG. 3 illustrates deposition of a polysilicon and a tungsten-silicon layer as well as a deposition of a n+ region of the buried contact.

FIG. 4 illustrates the etching and deposition of source/drain regions.

FIG. 7 illustrates the opening of windows for placing electrical contacts.

FIG. 8 illustrates the deposition of silicon-rich nitride for forming the vertical resistor.

DETAILED DESCRIPTION OF THE PRESENT INVENTION

Figure 5:
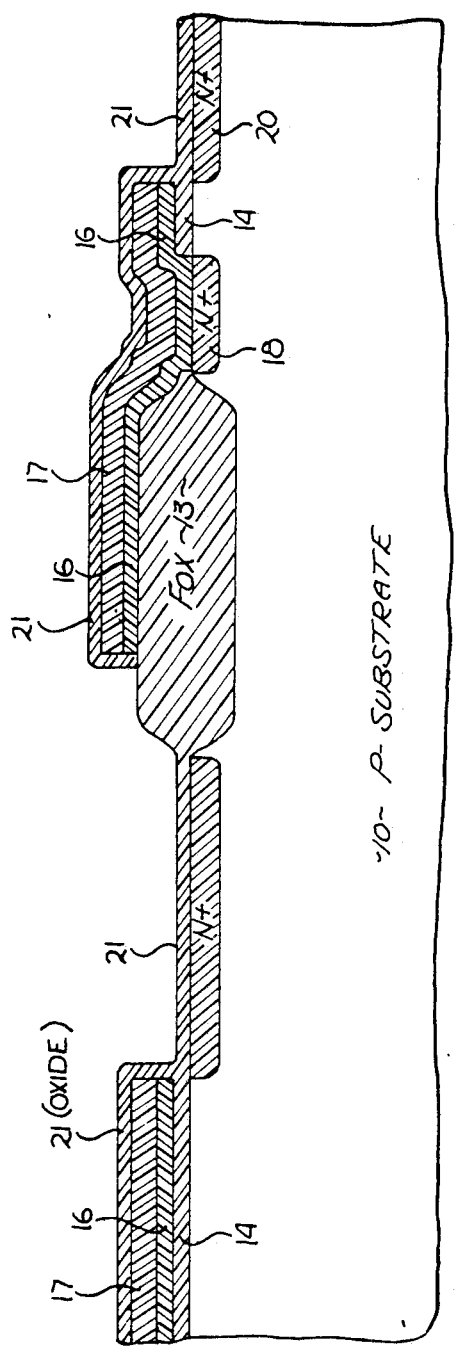
FIG. 5 illustrates the growth of an oxide layer.

A process for fabricating a contact-window resistor element in an MOS integrated circuit is described. While the currently preferred embodiment for the present invention involves placement of the contact-window resistor over a metal-plated polysilicon region of a field-effect transistor device, it will be obvious to one skilled in the art that the invention may readily be adapted for use in other embodiments. In the following description, numerous specific details are set forth to provide a thorough understanding of the present invention. Again, it will be obvious to one skilled in the art that the invention may be employed without these specific details. In other instances, well-known processing steps have not been described in detail in order not to unnecessarily obscure the present invention.

Referring to FIG. 1, a p-type monocrystalline silicon substrate 10 is illustrated. Following the growth of a relatively thin pad-oxide layer 11 of 500 to 1000 A on the surface of the substrate 10, a nitride layer 12 of 700 to 1200 A is formed over the pad-oxide layer 11. By lithography a nitride layer 12 is removed over the areas where thick field oxide is desired. Then a field-oxide (FOX) region 13 is thermally grown in areas without the nitride layer 12 to a thickness of 5000 to 10,000 A.

Referring to FIG. 2, the nitride layer 12 and pad-oxide layer 11 are removed by conventional etching methods. A gate-oxide layer 14 of 200 to 250 A is grown. Where a buried contact is desired, an opening 15 is made by conventional lithographic process.

Referring to FIG. 3, a polysilicon layer 16 of 1000 to 3000 A is deposited on the gate-oxide layer 14. For low resistance gate application, a tungsten-silicon (W-Si) layer 17 of 2000 to 3000 A is deposited on the polysilicon layer 16. The polysilicon layer 16 is doped by phosphorus diffusion. The doping of polysilicon layer 16 to form an n+ layer may be accomplished either prior to or after the deposition of W-Si layer 17. The doping process also forms an n+ buried contact 18 at opening 15.

In FIG. 4, W-Si layer 17, polysilicon layer 16 and gate-oxide layer 14 are patterned and etched to provide openings 19. This process is then followed by a self-aligned implant to form n+ regions 20.

After the formation of regions 20, a high-temperature re-oxidation process will grow an oxide layer 21 anywhere where silicon or tungsten-silicon is exposed as shown in FIG. 5, wherein W-Si layer 17 is covered by oxide layer 21. The oxide layer 21 also grows over the opening 19 wherein the implant regions 20 are also annealed during the growth process of the oxide layer 21.

Figure 6:
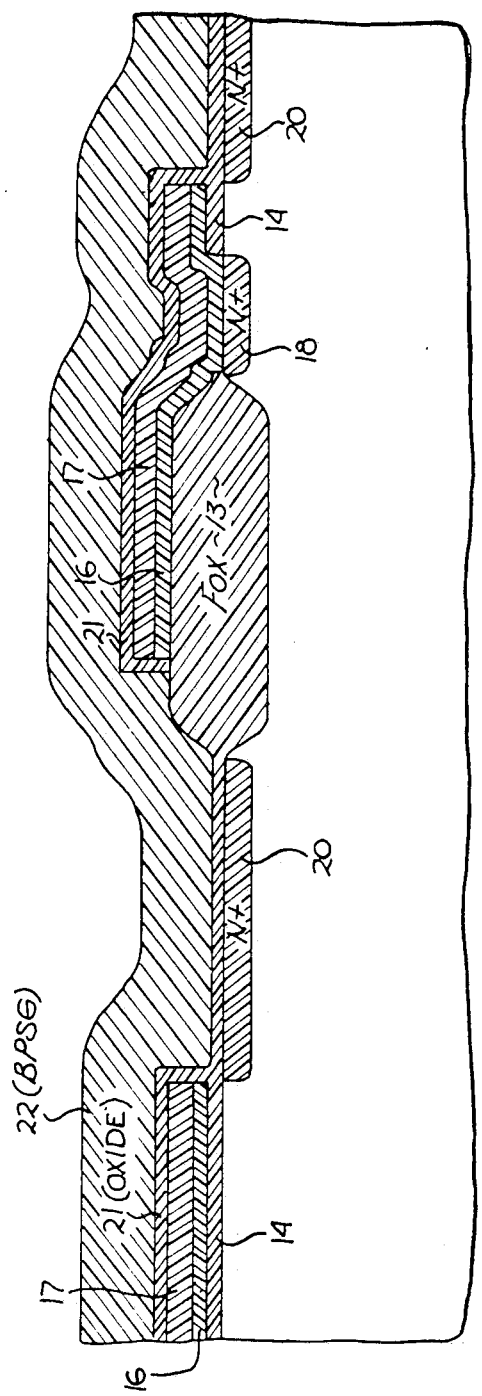
FIG. 6 illustrates the deposition of a glass film layer.

Referring to FIG. 6, either a boro-phosphosilicate glass (BPSG) or phosphosilicate glass (PSG) film layer 22 is deposited over the complete surface and reflowed to smooth the topology. Then, contact windows 23, 24 and 25 are opened in layers 21 and 22 by lithography and etching methods as shown in FIG. 7.

FIG. 8 illustrates the application of the actual resistor material to the substrate. While potentially any insulative material doped with silicon may be used for this purpose, the currently preferred embodiment uses silicon-rich silicon nitride obtained through plasma enhanced chemical vapor deposition (PECVD). A Si-rich nitride film layer 26 is deposited and patterned over window 25 by PECVD method. The PECVD process is accomplished with a mixture of silane, nitrogen, and ammonia at a total pressure of, for example, 0.5–1.5 T, and at a temperature of; for example, 308–305 degrees C. The partial pressure of silane may be, for example, 0.2–0.6 T, while that of nitrogen may be, for example, 0.3–0.8 T. The amount of ammonia to be used in the process is relatively small, and is varied to control the ratio of silicon nitride to silicon dopant deposited: a relatively lower ammonia concentration in the PECVD mixture gives a relatively higher silicon dopant concentration in the resistor material deposited on the substrate.

The grain size of the material to which the resistor element 26 is applied determines the thickness of the layer desired, and a thicker semi-insulative layer requires more silicon dopant to afford the same resistivity. Tungsten-silicide, having a relatively large grain size, requires a relatively thick semi-insulative layer to avoid current spiking through the semi-insulative layer. In this case, the semi-insulative layer may be, for example, 1000–2000 A thick. In areas where the Si-rich nitride film is not desired, removal is accomplished by conventional wet etching or plasma etching methods. Alternatively, Si-rich nitride film may be deposited by low-temperature e-gun evaporation method and the lift-off masking method employed.

Figure 9:
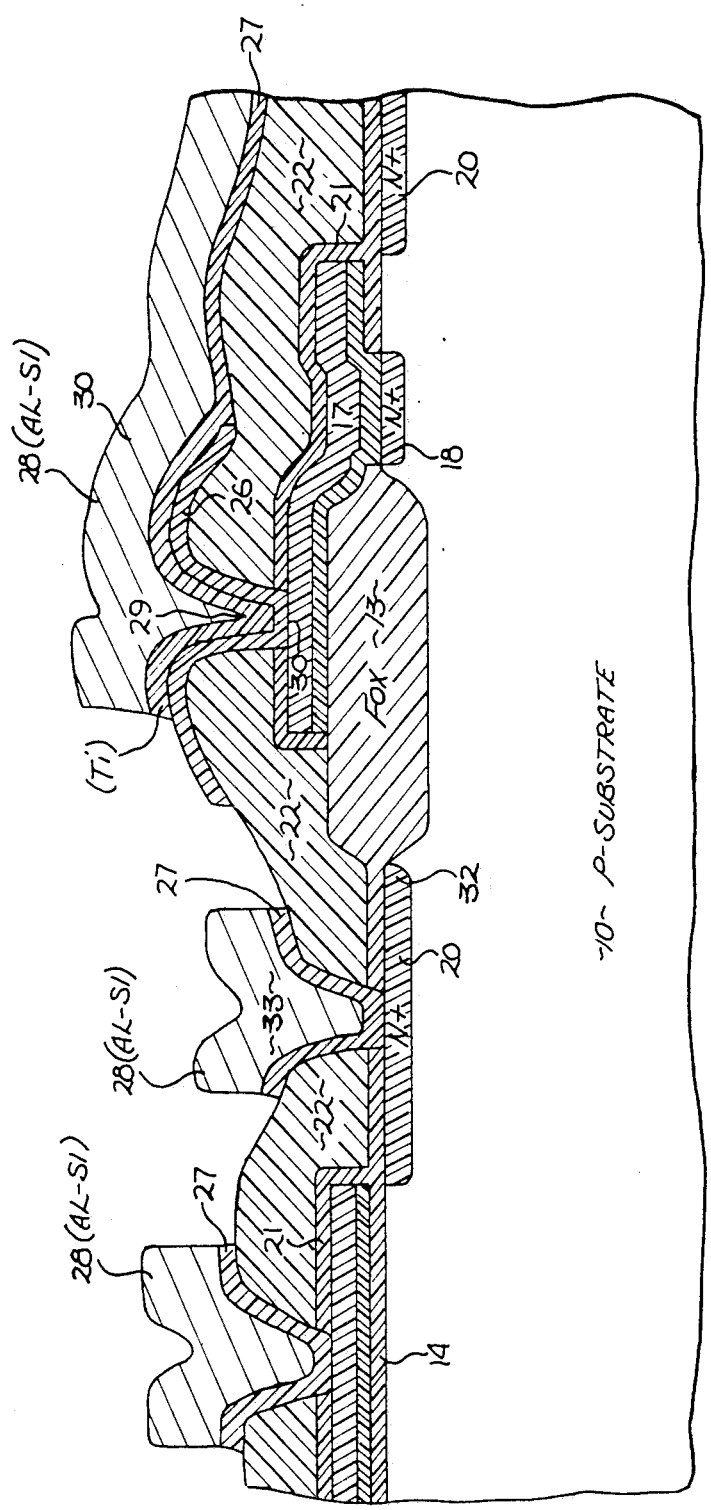
FIG. 9 illustrates the metallization step of laying the electrical contacts.

Referring to FIGS. 8 and 9, a titanium layer 27 is deposited over windows 23 and 24, as well as over the Si-rich nitride layer 26 over window 25. The Ti layer 27 thickness is of 500 to 1000 A. The Ti layer 27 is known to prevent aluminum for shorting the underlying silicon or Si-rich nitride film. Other well-known barrier metals such as TiN or tungsten can be used as well. An aluminum-silicon region 28 formed above the Ti layers 27 provides the electrical contact. Thus, the Al-Si region 29 is in electrical contact with a contact-window resistor layer 26. Resistance is provided by the film of Si-rich nitride film layer 26 located vertically between electrical contact 30 and a conductive region 29. A source region 32 makes simple electrical contact with metal member 33, where no resistor is present. Although a vertical contact load resistor is shown located over the FOX region 13, it could also be located above the contacts defined directly over the n+ diffusion regions 20, or the silicide buried region above diffusion region 18. Metal layer 28 is normally called metal 1 and whenever it is advantageous to add a second level metal, the vertical load resistor is also applicable.

Figure 10:
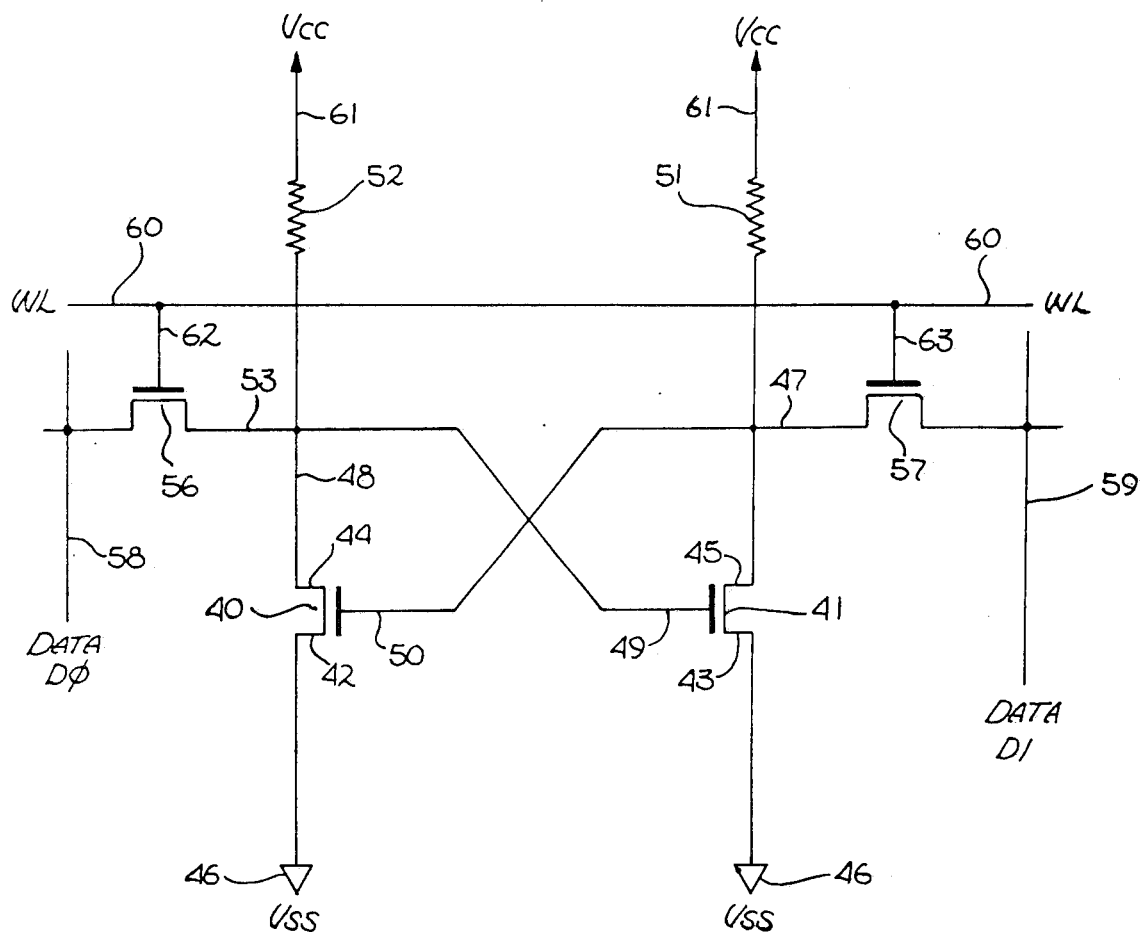
FIG. 10 is an electrical schematic diagram of a memory cell.
Figure 11:
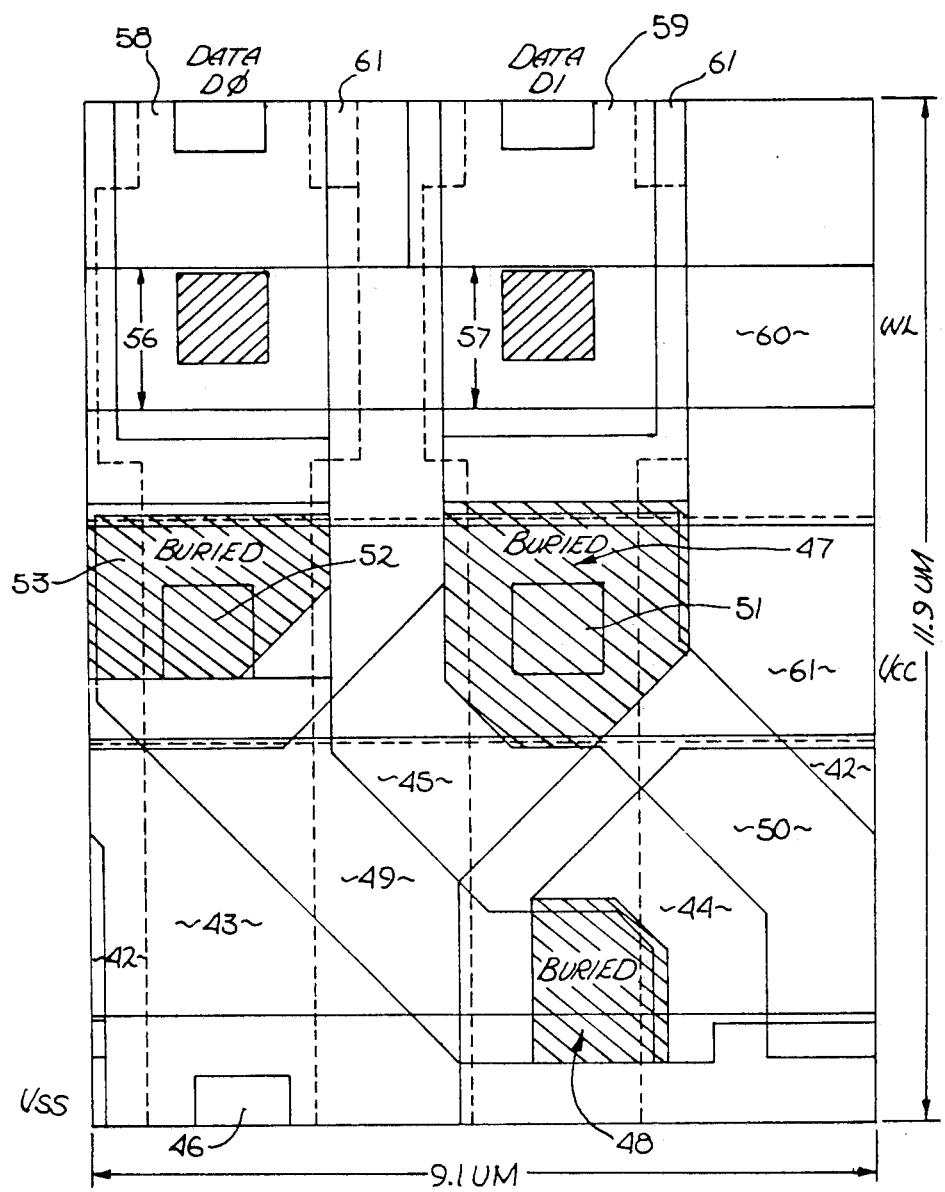
FIG. 11 is a layout of the memory cell depicted in FIG. 10.

Referring now to FIGS. 10 and 11, a bistable static random access memory cell utilizing the teachings of the present invention is illustrated. FIG. 10 is a schematic diagram and FIG. 11 is a semiconductor chip layout of the schematic of FIG. 10. The labels used in FIG. 10 correspond to the same levels in FIG. 11. The circuit consists of a pair of cross-coupled transistors 40 and 41, each having its source 42 and 43 connected to ground 46 ($V_{ss}$). The drain 44 of transistor 40 is coupled via a buried contact 48 to the gate 49 of transistor 41, while the drain 45 of transistor 41 is connected at a buried contact 47 to the gate 50 of transistor 40, providing the cross-coupled connection of a bistable circuit. The gate 49 of transistor 41 and the drain 44 of transistor 40 are further connected through a resistor 52 to a first-level metal strip 61 which is $V_{cc}$. The resistor 52 is a contact-window resistor fabricated in accordance with the teachings of the present invention. Similarly, the drain 45 of transistor 41 and the gate 50 of transistor 40 are connected through a contact-window resistor 51 to the $V_{cc}$ by strip 61. Second-level metal strips which are data lines 58 and 59 are connected to a pair of select transistors 56 and 57, respectively. Transistors 56 and 57 are a common W-Si gate strip which is the word address line (WL) 60. WL 60 is coupled to gates 62 and 63 of transistors 56 and 57. Transistor 56 is coupled to the gate 49 at a buried contact 53 of transistor 41 which is in turn coupled to the drain 44 of transistor 40. Transistor 57 is coupled to the drain 45 of transistor 41. Data line 58 is coupled to transistor 56 and data line 59 is coupled to transistor 57.

The present invention offers a number of advantages when compared with prior art technologies. The invention, in general, utilizes fewer masking steps for fabrication than were required by earlier techniques. In addition, the final circuit exhibits a much lower surface contour, resulting in fewer problems with fracturing of overlying metal or oxide coating. Because the resistivity is not dependent on the precise length and width of a polysilicon load device, the present process requires no critical masking steps. Further, plasma techniques allow for low temperature deposition. Although the present invention is described in a particular embodiment, the present invention is highly versatile and can readily be used to provide resistance between two polysilicon members, two metal members, a polysilicon and a metal member, a polysilicon member and the substrate, a metal member and the substrate, etc. The high capacitance of the resistor element makes the present invention less susceptible than prior art technologies to soft errors induced by stray alpha articles.

Thus, an improved resistor element has been described for use in MOS integrated circuits. Between two conductive regions separated by an insulative layer, resistance is provided by a thin Si-rich nitride film deposited in a contact window opened in the insulative layer.

We claim:

1. A process for fabricating a resistor in a semiconductor device between two conductive regions, comprising the formation of plasma enhanced chemical vapor deposited (PECVD) semi-insulative film, comprised of silicon-enriched silicon nitride formed of silane, nitrogen and ammonia, between said conductive regions, and said film contacting both said conductive regions and providing electrical resistance between said conductive regions, whereby a resistor element is fabricated.

2. A process for fabricating an integrated circuit resistor, comprised of silicon-enriched silicon nitride, between two conductive regions which are separated by an insulative layer, comprising the steps of:
    forming a first conductive region on a substrate;
    forming a first insulative layer on said first conductive region;
    opening a window in said first insulative layer;
    forming a semi-insulative film, comprised of silicon-enriched silicon nitride having a mixture of silane, nitrogen and ammonia and formed by a plasma enhanced chemical vapor deposition technique in said window, said film contacting said first conductive region;
    forming a second conductive region on said film;
    whereby a silicon-enriched silicon nitride resistor element is fabricated between said conductive regions.

3. The process defined by claim 2 further comprisng the steps of:
    forming a second insulative layer on said first insulative layer prior to forming said window; and
    opening said window in both said insulative layers.

4. The process defined by claims 3 wherein said second insulative layer is comprised of glass.

5. A process for fabricating a silicon-enriched silicon nitride resistor in a semiconductor device, comprising the steps of:
    forming a first conductive layer on a substrate;
    forming a first insulative layer on said first conductive layer;
    opening a window in said first insulative layer;
    forming a film of silicon-enriched silicon nitride in said window, said silicon-rich silicon nitride film being deposited in said window using a plasma enhanced chemical vapor deposition technique, said silicon-rich silicon nitride film contacting said first conductive layer;
    forming a second conductive layer on said silicon-rich silicon nitride film, said second conductive layer contacting said silicon-rich silicon nitride film.

6. The process defined by claim 5 wherein said first insulative layer is comprised of an oxide layer.

7. The process defined by claim 6 wherein said second conductive layer is comprised of a layer of titanium on said silicon-enriched silicon nitride film and a layer of aluminium-silicon on said titanium layer.

8. The process defined by claim 7 further comprising the steps of:
    forming a second insulative layer on said first insulative layer prior to opening said window; and
    opening said window in both said insulative layer.

9. A process for fabricating a silicon-enriched silicon nitride integrated circuit resistor comprising the steps of:
    growing a gate-oxide layer on a substrate;
    removing a portion of said gate-oxide layer to expose said substrate;
    forming a polysilicon layer on said gate-oxide and said portion of exposed substrate;
    doping said polysilicon layer by phosphorus diffusion wherein a buried contact region is formed in said portion of exposed substrate;
    forming a layer of tungsten-silicon on said polysilicon layer;
    growing an oxide layer on said tungsten-silicon layer;
    forming an insulative layer on said oxide layer;
    opening a window in said insulative layer and said oxide layer, wherein said opening extends to said tungsten-silicon layer;
    forming a film of silicon-enriched silicon nitride in said window, said silicon-enriched silicon nitride film being deposited in said window using a plasma enhanced chemical vapor deposition technique, said silicon-enriched silicon nitride film contacting said tungsten-silicon layer;
    forming a conductive layer on said silicon-enriched silicon nitride film, said conductive layer having a titanium layer and an aluminum-silicon layer.

10. The process defined by claim 9 wherein said insulating layer is comprised of a material selected from the group consisting of phosphorus glass and borophosphosilicate glass.

11. The process defined by claim 1, wherein said silicon-enriched silicon nitride film is formed by a mixture of silane, nitrogen, and ammonia at an approximate pressure of 0.5–1.5 T, and at a temperature of approximately 308°–505° C.

* * * * *